(12) United States Patent
Sakai

(10) Patent No.: US 8,294,183 B2
(45) Date of Patent: *Oct. 23, 2012

(54) SEMICONDUCTOR SUBSTRATE, METHOD OF FABRICATING THE SAME, SEMICONDUCTOR DEVICE, AND METHOD OF FABRICATING THE SAME

(75) Inventor: Shiro Sakai, Tokushima (JP)

(73) Assignee: Seoul Opto Device Co., Ltd., Ansan-si (KR)

( * ) Notice: Subject to any disclaimer, the term of this patent is extended or adjusted under 35 U.S.C. 154(b) by 190 days.

This patent is subject to a terminal disclaimer.

(21) Appl. No.: 12/650,276

(22) Filed: Dec. 30, 2009

(65) Prior Publication Data

US 2010/0314661 A1    Dec. 16, 2010

(30) Foreign Application Priority Data

Jun. 10, 2009   (JP) .................................. 2009-139212
Jul. 15, 2009   (JP) .................................. 2009-166682

(51) Int. Cl.
  H01L 21/02   (2006.01)
  H01L 29/66   (2006.01)
  H01L 21/00   (2006.01)
(52) U.S. Cl. ................ 257/200; 257/183; 257/E25.032; 438/46
(58) Field of Classification Search .................. 257/183, 257/94, E21.09, E29.005; 438/507
See application file for complete search history.

(56) References Cited

U.S. PATENT DOCUMENTS

| | | | |
|---|---|---|---|
| 6,024,884 A | 2/2000 | Bryant et al. | |
| 7,196,399 B2 | 3/2007 | Usui et al. | |
| 7,230,282 B2 | 6/2007 | Shibata | |
| 7,435,608 B2 | 10/2008 | Shibata | |
| 7,642,112 B2 | 1/2010 | Atoji et al. | |
| 8,026,119 B2* | 9/2011 | Kim et al. | 438/46 |
| 2001/0053618 A1 | 12/2001 | Kozaki et al. | |
| 2002/0197825 A1* | 12/2002 | Usui et al. | 438/459 |
| 2003/0047746 A1 | 3/2003 | Kuniyasu et al. | |
| 2003/0143771 A1* | 7/2003 | Kidoguchi et al. | 438/46 |

(Continued)

FOREIGN PATENT DOCUMENTS

JP   2004-0266624   1/2004

(Continued)

OTHER PUBLICATIONS

Haino et al., "Buried Tungsten Metal Structure Fabricated by Epitaxial-Lateral-Overgrown GaN via Low-Pressure Metalorganic Vapor Phase Epitaxy", Japan Journal of Applied Physics, vol. 39, 2000, pp. 449-452.

(Continued)

*Primary Examiner* — Matthew Landau
*Assistant Examiner* — Khaja Ahmad
(74) *Attorney, Agent, or Firm* — H.C. Park & Associates, PLC

(57) ABSTRACT

The present invention provides a fabrication method of a semiconductor substrate, by which a planar GaN substrate that is easily separated can be fabricated on a heterogeneous substrate, and a semiconductor device which is fabricated using the GaN substrate. The semiconductor substrate comprises a substrate, a first semiconductor layer arranged on the substrate, a metallic material layer arranged on the first semiconductor layer, a second semiconductor layer arranged on the first semiconductor layer and the metallic material layer, and voids formed in the first semiconductor layer under the metallic material layer.

25 Claims, 13 Drawing Sheets

U.S. PATENT DOCUMENTS

| | | | |
|---|---|---|---|
| 2003/0183157 A1 | 10/2003 | Usui et al. | |
| 2004/0021147 A1 | 2/2004 | Ishibashi et al. | |
| 2004/0206967 A1 | 10/2004 | Oshima et al. | |
| 2004/0209442 A1* | 10/2004 | Takakuwa et al. | 438/458 |
| 2005/0077512 A1 | 4/2005 | Yoon et al. | |
| 2005/0194564 A1 | 9/2005 | Fujita et al. | |
| 2006/0006408 A1* | 1/2006 | Suehiro et al. | 257/103 |
| 2006/0046511 A1* | 3/2006 | Shibata et al. | 438/767 |
| 2006/0151797 A1 | 7/2006 | Park | |
| 2006/0151801 A1* | 7/2006 | Doan et al. | 257/99 |
| 2008/0014723 A1 | 1/2008 | Shibata | |
| 2008/0251803 A1 | 10/2008 | Cho et al. | |
| 2009/0093122 A1 | 4/2009 | Ueda et al. | |
| 2009/0098677 A1 | 4/2009 | Shibata | |
| 2010/0015739 A1 | 1/2010 | Park | |
| 2010/0139758 A1 | 6/2010 | Chang et al. | |
| 2010/0219436 A1 | 9/2010 | Watanabe | |
| 2010/0252859 A1 | 10/2010 | Son | |
| 2010/0314661 A1 | 12/2010 | Sakai | |
| 2010/0320506 A1 | 12/2010 | Varangis et al. | |
| 2011/0053303 A1 | 3/2011 | Kim et al. | |

FOREIGN PATENT DOCUMENTS

| | | |
|---|---|---|
| JP | 2005-057220 | 3/2005 |
| JP | 2005-064247 | 3/2005 |
| JP | 2005-085851 | 3/2005 |
| KR | 1020020010583 | 2/2002 |
| KR | 10-2003-0032965 | 4/2003 |
| KR | 1020030030019 | 4/2003 |
| KR | 10-2005-0035565 | 4/2005 |
| KR | 10-2006-0081107 | 7/2006 |
| KR | 10-2006-0135568 | 12/2006 |
| KR | 10-2007-0009854 | 1/2007 |
| KR | 1020070005984 | 1/2007 |
| KR | 10-2007-0101424 | 10/2007 |
| KR | 10-2008-0093222 | 10/2008 |
| KR | 10-2008-0100466 | 11/2008 |
| WO | 03/098710 | 11/2003 |

OTHER PUBLICATIONS

Hasegawa et al., "Polycrystalline GaN for light emitter and field electron emitter applications", Thin Solid Films 487 (2005), pp. 260-267.
Non-Final Office Action of U.S. Appl. No. 12/929,712 issued Dec. 2, 2011.
International Search Report issued Sep. 28, 2011, corresponding to International Application No. PCT/KR2011/000871.
Notice of Allowance dated May 27, 2011, issued for related co-pending U.S. Appl. No. 12/805,958.
Notice of Allowance of U.S. Appl. No. 12/805,958 issued on Feb. 25, 2011.
PCT Search Report of PCT/KR2010/004816 dated Feb. 24, 2011, corresponding to U.S. Appl. No. 12/509,958.
International Search Report of PCT/KR2010/003724 issued on Jan. 14, 2011, corresponding to U.S. Appl. No. 12/801,455.
Written Opinion of PCT/KR2010/003724 issued on Jan. 14, 2011, corresponding to U.S. Appl. No. 12/801,455.
Non-Final Office Action of U.S. Appl. No. 13/137,124 issued Nov. 25, 2011.
Notice of Allowance issued for related U.S. Appl. No. 13/137,124 dated Feb. 6, 2012.
Final Office Action of U.S. Appl. No. 12/929,712 dated Apr. 5, 2012.
Notice of Allowance of U.S. Appl. No. 13/506,295 issued on Jul. 25, 2012.
Non-Final Office Action of U.S. Appl. No. 12/801,455 issued Aug. 29, 2012.

* cited by examiner

Fig. 4
(A) SEM cross-section of enlarged area
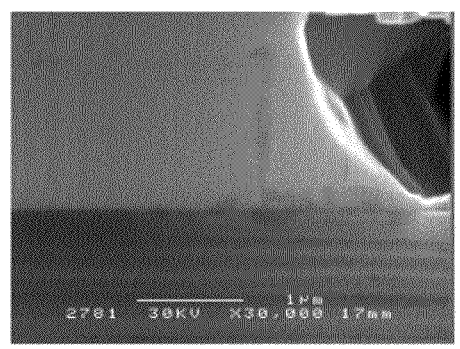
(B) Ga EDX diagram
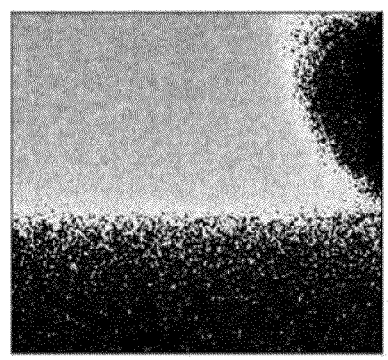
(C) Al EDX diagram
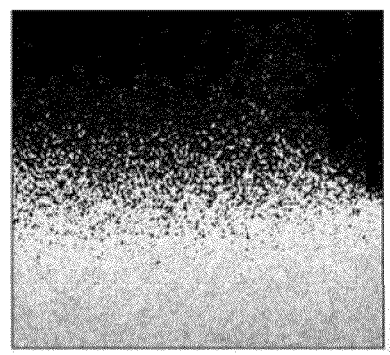
(D) O EDX diagram
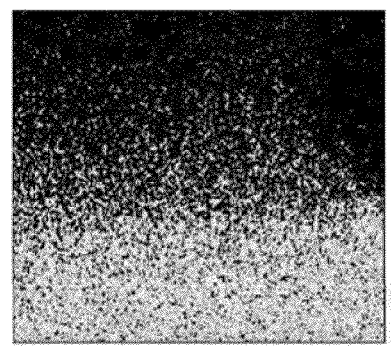

Fig. 5
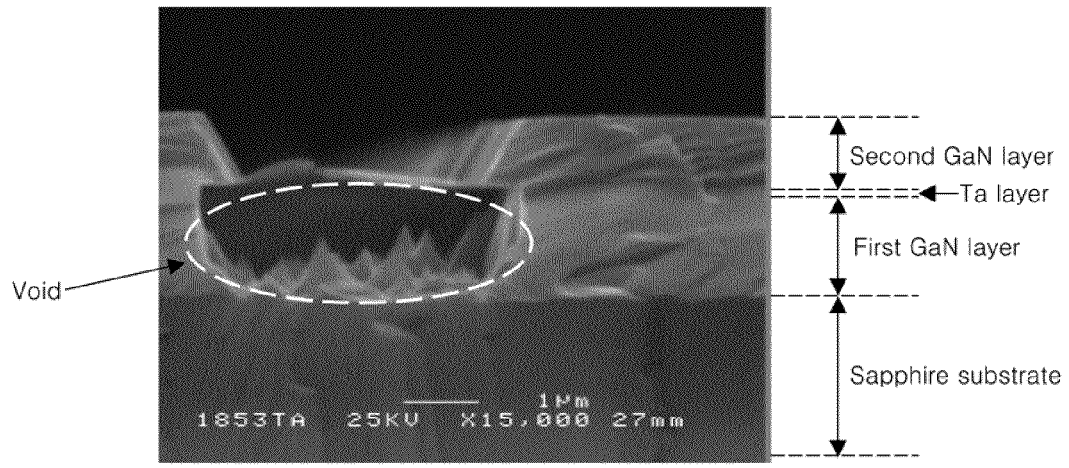
(A) SEM cross-section of substrate
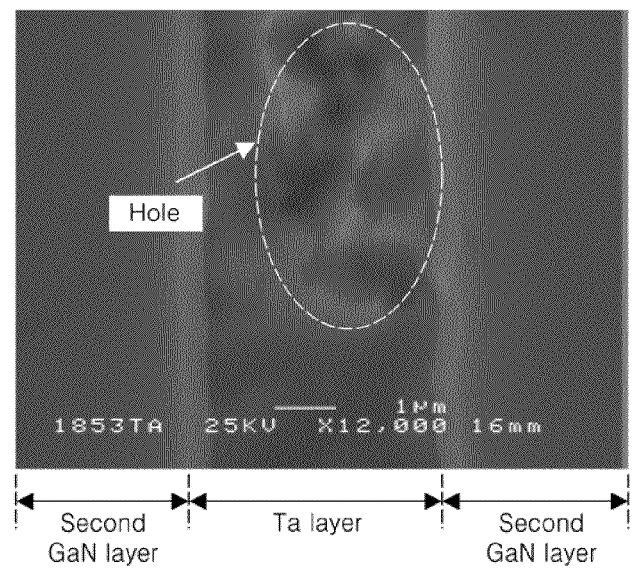
(B) SEM surface photograph of substrate Fig. 6
(A) Ga EDX diagram
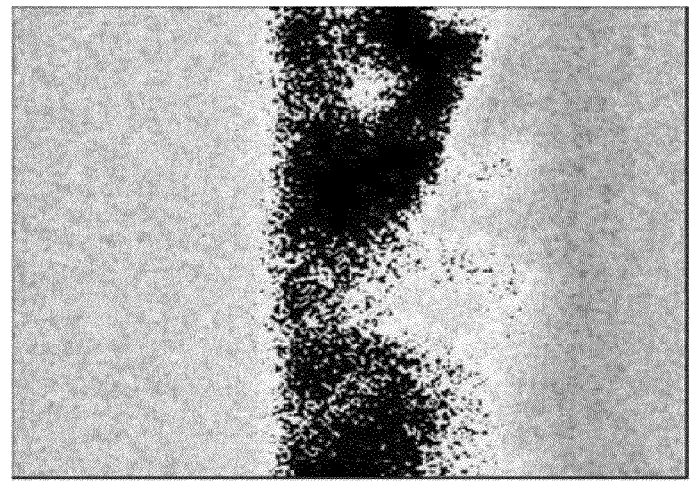
(B) Ta EDX diagram
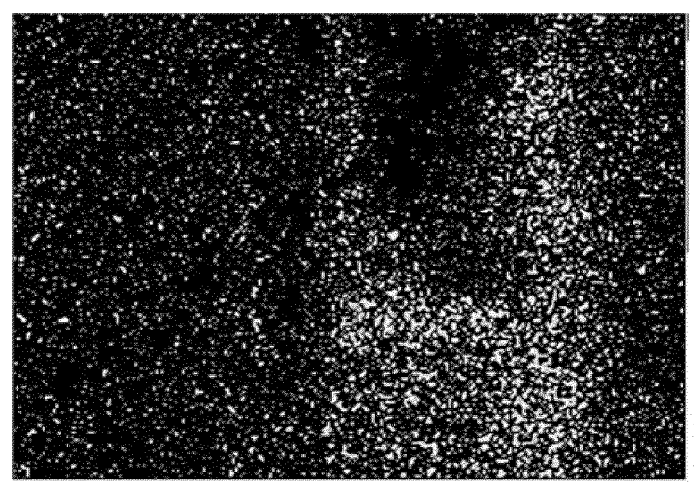

Fig. 7
(A) SEM perspective view of substrate
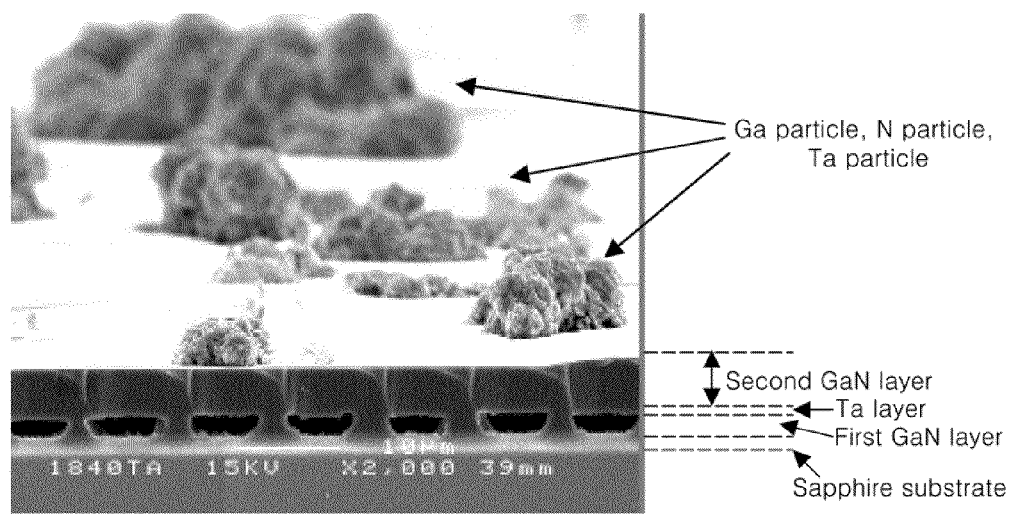
(B) SEM surface photograph of substrate
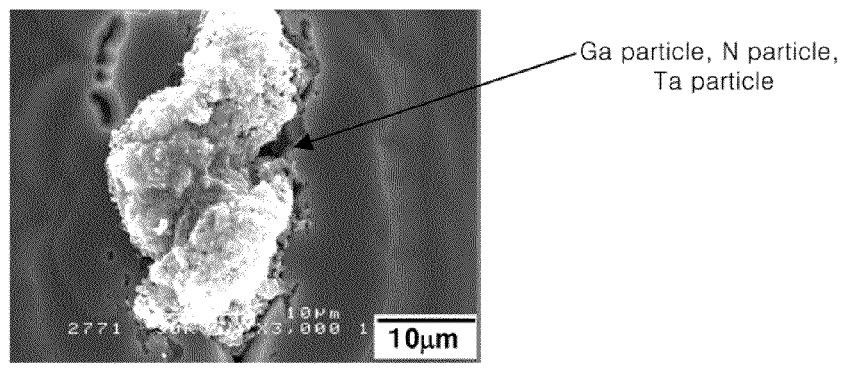

Fig. 8
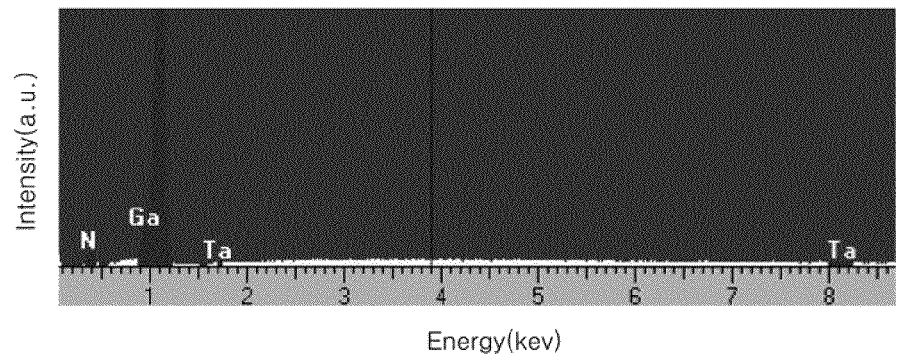
(A) EDX spectrum diagram
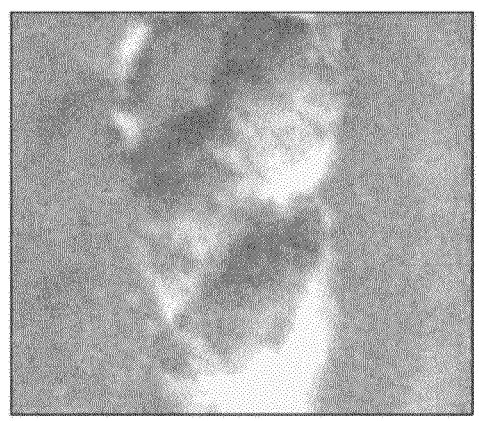
(B) Ga EDX diagram
(C) N EDX diagram Fig. 9
(A) SEM cross-section of void
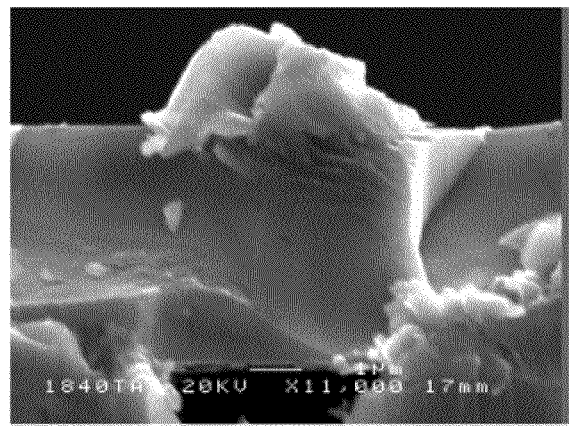
(B) EDX spectrum diagram
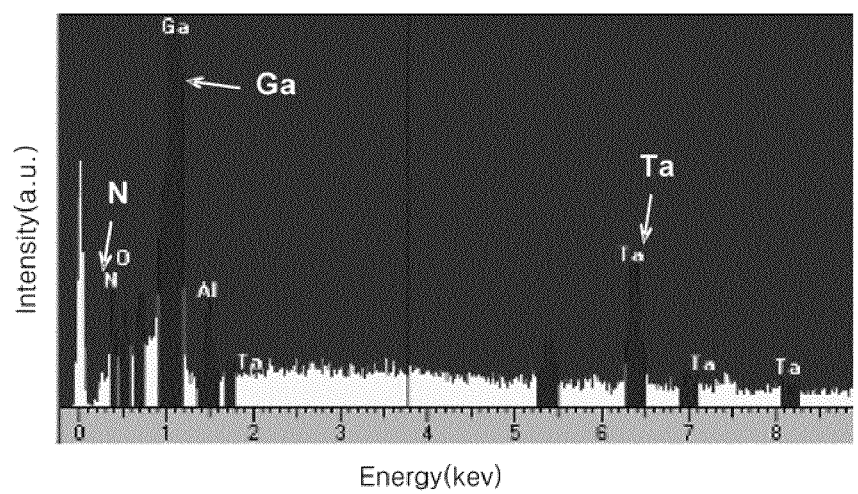

Fig. 10
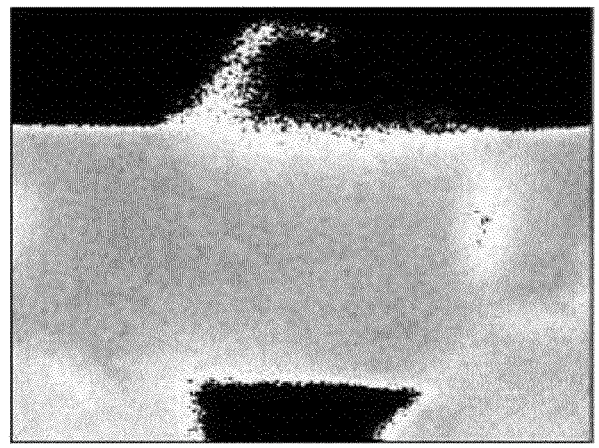
(A) Ga EDX diagram
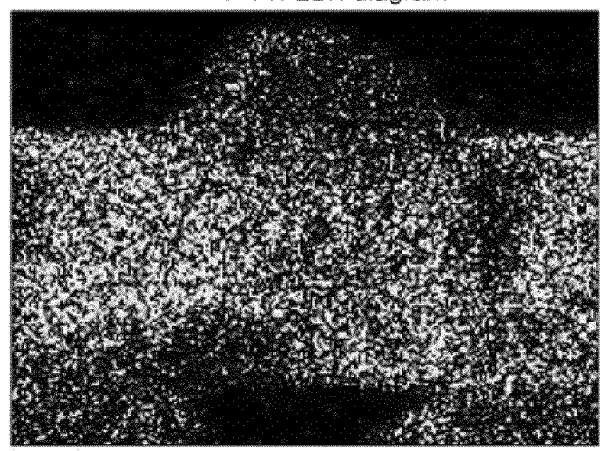
(B) N EDX diagram
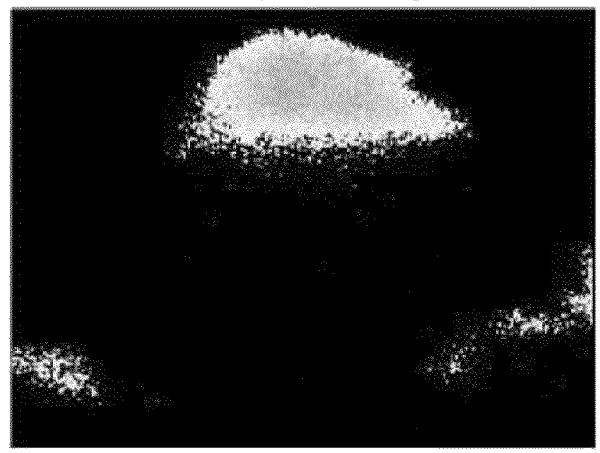
(C) Ta EDX diagram Cutting position Fig. 15
(A) Example of forming
Ta layer of 5 nm on GaN layer
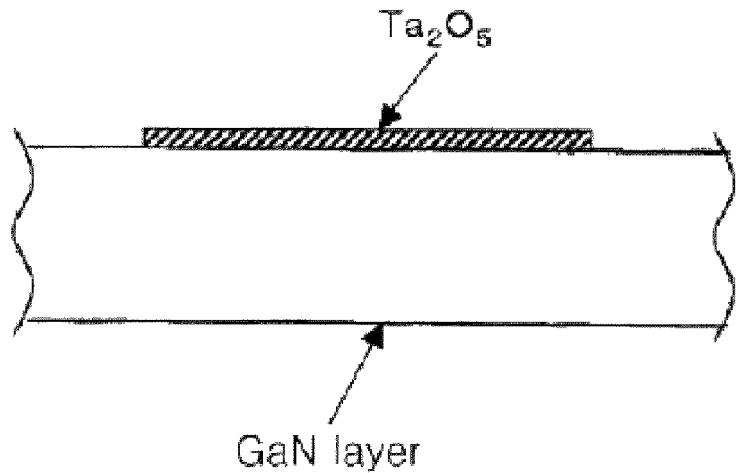
(B) Example of forming
Ta layer of 100 nm on GaN layer
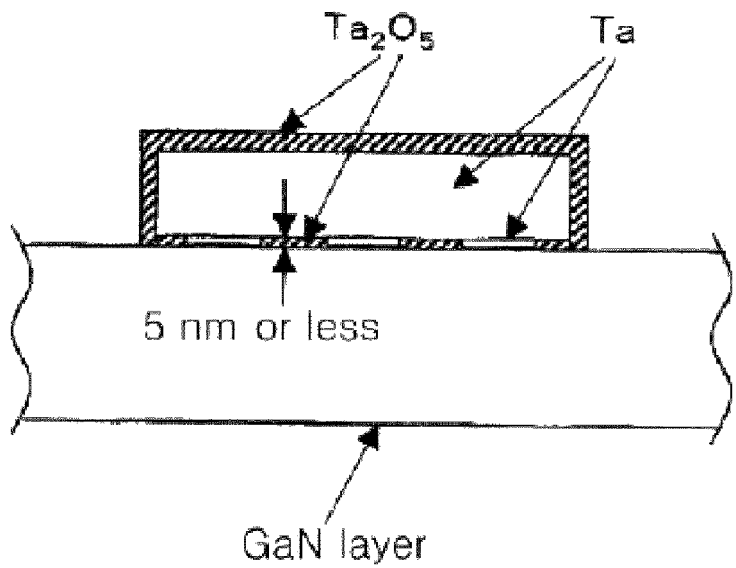

Fig. 16
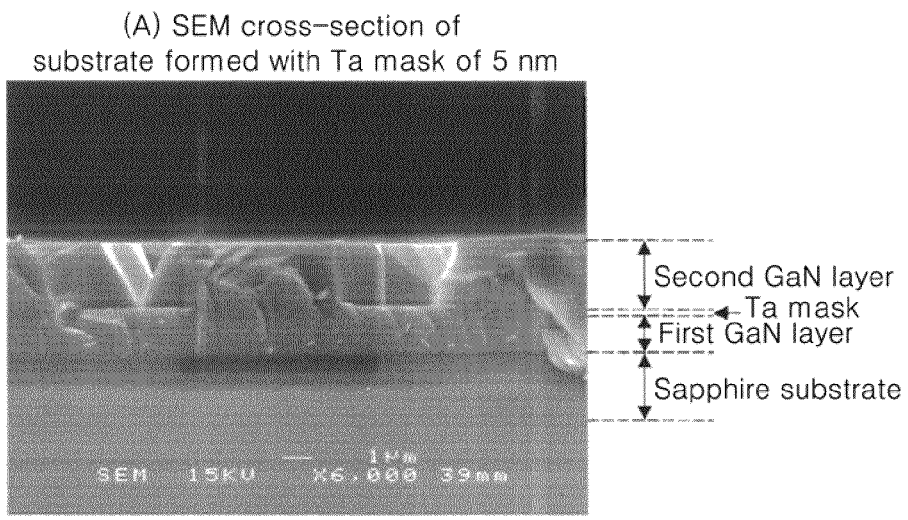
(A) SEM cross-section of
substrate formed with Ta mask of 5 nm
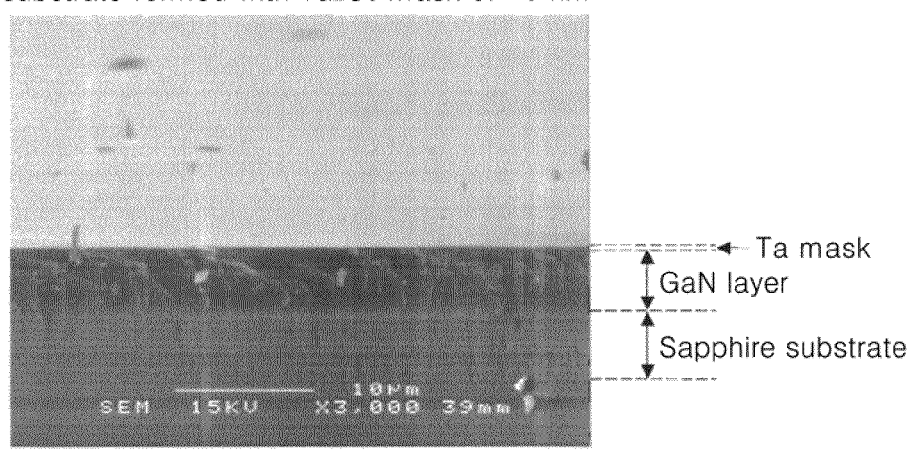
(B): SEM cross-section of
substrate formed with $Ta_2O_5$ mask of 10 nm

US 8,294,183 B2

SEMICONDUCTOR SUBSTRATE, METHOD OF FABRICATING THE SAME, SEMICONDUCTOR DEVICE, AND METHOD OF FABRICATING THE SAME

CROSS-REFERENCE TO RELATED APPLICATIONS

This application claims priority from and the benefit of Japanese Patent Application No. JP 2009-139212, filed on Jun. 10, 2009, and Japanese Patent Application No. JP 2009-166682, filed on Jul. 15, 2009, which are hereby incorporated by reference for all purposes as if fully set forth herein.

BACKGROUND OF THE INVENTION

1. Field of the Invention

The present invention relates to a semiconductor substrate, a method of fabricating the same, a semiconductor device, and a method of fabricating the same. More particularly, the present invention relates to a semiconductor substrate suitable for forming a GaN layer thereon, a method of fabricating the same, a semiconductor device, and a method of fabricating the same.

2. Discussion of the Background

Light emitting diodes (LEDs) that have a gallium nitride (GaN)-based semiconductor may be used in various devices including traffic signals, backlights in a liquid crystal panel, and the like. It is known that the light emitting efficiency of LEDs is influenced by the dislocation density of crystals and defects. GaN-based semiconductor crystals may be grown on a heterogeneous substrate such as sapphire. However, lattice mismatch or a difference of thermal expansion coefficients may occur between a GaN layer and a substrate, which results in a high dislocation density or an increase in defects.

The crystal growth of a GaN-based semiconductor may be performed on a homogeneous substrate such as a GaN substrate. However, it may be difficult to form a GaN melt and to fabricate a GaN substrate due to a high dissociation rate of nitrogen in GaN, and the like. A GaN bulk crystal grown for a GaN substrate may be separated by mechanical grinding or laser ablation. However, it may be difficult to reproduce a GaN substrate of a practical size. Particularly, the laser ablation may require a considerable amount of time to perform, which increases the cost of a GaN substrate.

GaN crystal growth is shown and described in "Polycrystalline GaN for light emitter and field electron emitter applications" by S. Hasegawa, S. Nishida, T. Yamashita, and H. Asahi, (Thin Solid Layers 487 (2005) 260-267) (hereinafter "Hasegawa, et al."), and "Buried Tungsten Metal Structure Fabricated by Epitaxial-Lateral-Overgrown GaN via Low-Pressure Metalorganic Vapor Phase Epitaxy" M. Haino, et. al., (Jpn. J. Appl., 39 (2000) L449) (hereinafter "Haino, et. al."), which are hereby incorporated by reference in their entirety for all purposes as if fully set forth herein. For example, GaN crystals are respectively grown on quartz substrates, high-melting-point metal substrates of Tungsten (W), Molybdenum (Mo), Tantalum (Ta), and Niobium (Nb), and Silicon (Si) substrates using plasma assisted molecular beam epitaxy.

Since it may be difficult to fabricate the GaN substrate, and GaN substrate fabrication cost may also be increased as described above, a semiconductor device such as an LED or laser diode is frequently fabricated by growing a GaN layer on a heterogeneous substrate such as sapphire. However, the light emitting performance of LEDs may be degraded due to high dislocation density or the increase of defects, as described above. Further, a sapphire substrate has a lower thermal conductivity than that of the GaN substrate and may reduce a heat dissipation property of a device. When an LED or laser diode is fabricated, using a sapphire substrate may have a negative influence on the operational lifetime of the LED or laser diode.

SUMMARY OF THE INVENTION

The present invention provides a fabrication method, by which a planar and easily separated GaN substrate may be fabricated on a heterogeneous substrate at a low cost.

The present invention also provides a semiconductor device fabricated using the GaN substrate which may have improved performance or operational lifetime.

Additional features of the invention will be set forth in the description which follows, and in part will be apparent from the description, or may be learned by practice of the invention.

The present invention discloses a semiconductor substrate comprising: a substrate; a first semiconductor layer arranged on the substrate; a metallic material layer arranged on the first semiconductor layer; a second semiconductor layer arranged on the first semiconductor layer and the metallic material layer; and voids formed in the first semiconductor layer under the metallic material layer.

The present invention also discloses a method of fabricating a semiconductor substrate, comprising: forming a first semiconductor layer on a substrate; forming a metallic material layer on the first semiconductor layer; and forming a second semiconductor layer on the first semiconductor layer and the metallic material layer, wherein voids are formed in the first semiconductor layer under the metallic material layer while the second semiconductor layer is formed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 4(A) is a SEM cross-section of an enlarged area of FIG. 2 according to the first example of the first exemplary embodiment, FIG. 4(B), FIG. 4(C), and FIG. 4(D) are a Ga EDX diagram, an Al EDX diagram, and an O EDX diagram of the semiconductor substrate according to the first example of the first exemplary embodiment, respectively.

FIG. 5(A) is a SEM cross-section of the semiconductor substrate according to the first example of the first exemplary embodiment, and FIG. 5(B) is a SEM surface of the semiconductor substrate according to the first example of the first exemplary embodiment.

FIG. 6 is an EDX diagram of the semiconductor substrate according to the first example of the first exemplary embodiment, wherein (A) is a Ga EDX diagram and (B) is a Ta EDX diagram.

FIG. 7(A) and FIG. 7(B) are a SEM perspective view and a SEM surface of a semiconductor substrate according to a first comparative example, respectively.

FIG. 8(A), FIG. 8(B), and FIG. 8(C) are an EDX spectrum diagram, a Ga EDX diagram, and an N EDX diagram of FIG. 7(B) according to the first comparative example, respectively.

FIG. 9(A) is a SEM cross-section of a void according to the first comparative example, and FIG. 9(B) is an EDX spectrum diagram of FIG. 9(A).

FIG. 10(A), FIG. 10(B), and FIG. 10(C) are a Ga EDX diagram, an N EDX diagram, and a Ta EDX diagram of FIG. 9(A) according to the first comparative example, respectively.

FIG. 15(A) is a view schematically illustrating an exemplary embodiment in which a 5 nm thick Ta layer is changed into $Ta_2O_5$, and FIG. 15(B) is a view schematically illustrating an example in which a surface of a 100 nm thick Ta layer is changed into $Ta_2O_5$.

FIG. 16(A) is a SEM cross-section of a substrate on which a 5 nm thick Ta mask is formed, and FIG. 16(B) shows a SEM cross-section of a substrate on which a 10 nm thick $Ta_2O_5$ mask is formed.

DETAILED DESCRIPTION OF THE ILLUSTRATED EMBODIMENTS

Figure 1:
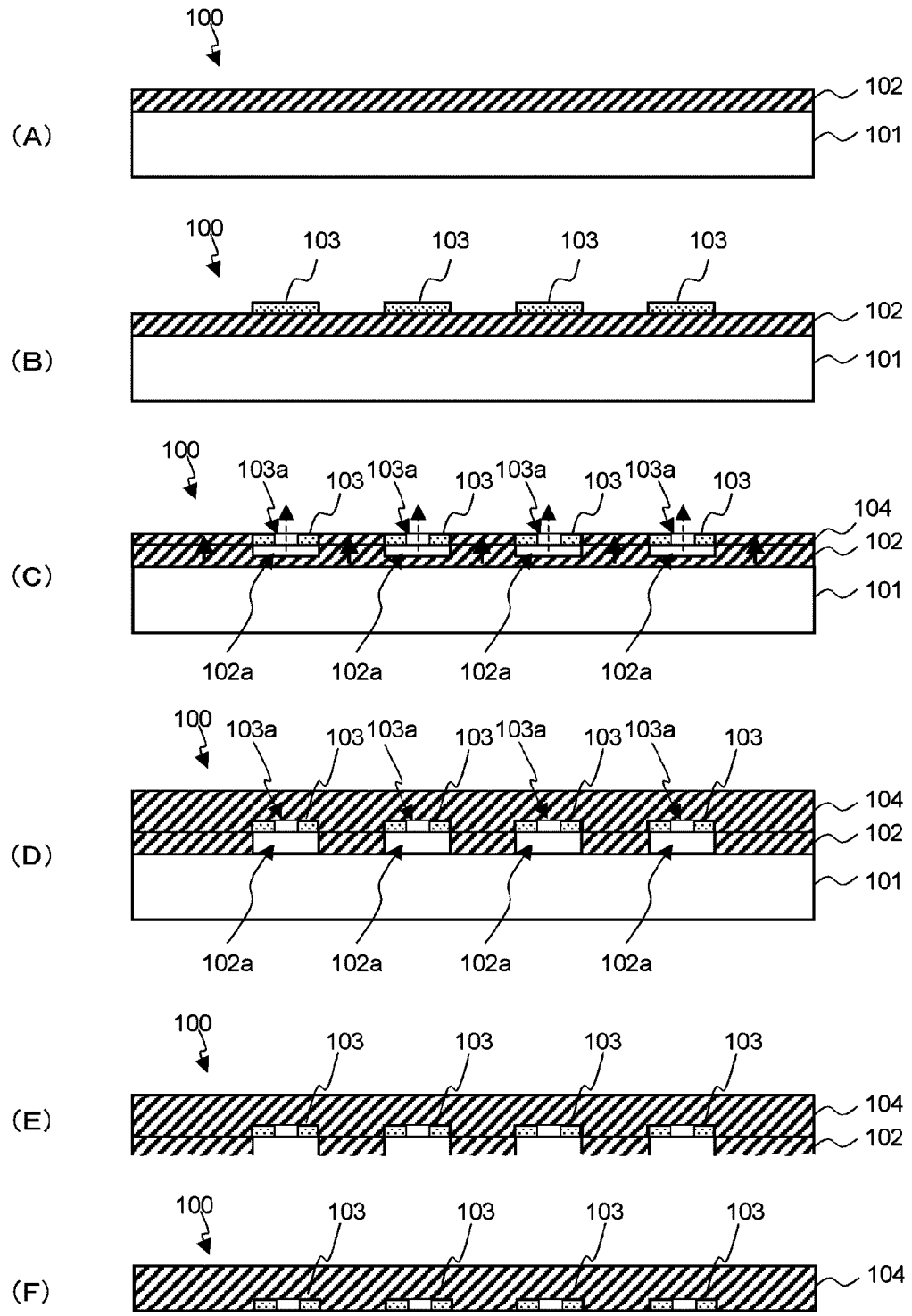
FIG. 1 is a view illustrating a method of fabricating a semiconductor substrate according to a first exemplary embodiment of the present invention, wherein (A) is a sectional view illustrating a process of forming a first GaN layer, (B) is a sectional view illustrating a process of forming a Ta layer, (C) is a sectional view illustrating an intermediate state of forming a second GaN layer, (D) is a sectional view illustrating that the second GaN layer is completely formed, (E) is a sectional view showing that a sapphire substrate is separated, and (F) is a sectional view of a GaN substrate completely formed.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 is a view schematically illustrating a method of fabricating a semiconductor substrate 100 according to a first exemplary embodiment, wherein (A) is a sectional view illustrating a process of forming a first GaN layer, (B) is a sectional view illustrating a process of forming a Ta layer, (C) is a sectional view illustrating an intermediate state of forming a second GaN layer, and (D) is a sectional view illustrating that the second GaN layer is completely formed.

In FIG. 1(A), reference numeral 101 designates a sapphire ($Al_2O_3$) substrate. First, a first GaN layer 102 having a thickness of about 2 µm is formed on the sapphire substrate 101.

Then, referring to FIG. 1(B), a Ta layer 103 (metallic material layer) having a thickness of about 50 nm is formed on the first GaN layer 102 in the shape of stripes with a width of 5 µm and an interval of 5 µm using an electron beam (EB) deposition technique and a lift-off technique. The thickness, width, and interval of the Ta layer 103 are only for illustrative purposes.

Thereafter, referring to FIG. 1(C), a second GaN layer 104 is formed on the first GaN layer 102 and the Ta layer 103 using metal organic chemical vapor deposition (MOCVD). The first GaN layer 102 and the second GaN layer 104 may include different semiconductor material. FIG. 1(C) illustrates an intermediate state of forming the second GaN layer 104. In the present exemplary embodiment, N in the first GaN layer 102 and Ta combine to produce TaN, which is changed into a different substance and rises into a vapor phase region in which the concentration of N is relatively high. TaN becomes unstable at over 900° C. and vaporized at over 1,000° C. As a result, vaporization causes holes 103a in the Ta layer 103 and voids 102a in the first GaN layer 102 to form. N in the first GaN layer 102 is used to produce TaN, but Ga remains in the first GaN layer 102. Since the Ga remaining in the first GaN layer 102 is the same as Ga that is deposited during the vapor phase growth, it is used as a source. GaN may also be grown on a Ta layer. As disclosed in Hasegawa, et al., the surface of the Ta layer 103 may consist of $Ta_2O_5$ as well as Ta due to a reaction with air, which will be described later.

Meanwhile, the second GaN layer 104 may have a thickness at least 0.5 times as large as a width of the Ta layer 103, and the thickness of the second GaN layer 104 may be below 1,000 µm so as to be used as a substrate.

Then, referring to FIG. 1(D), once the formation of the second GaN layer 104 is finished, the semiconductor substrate 100 is completed. If the formation of the second GaN layer 104 is continued using a MOCVD technique, etching of the first GaN layer 102 under the Ta layer 103 is performed, and formation regions of the voids 102a extend almost to a top surface of the sapphire substrate 101 as shown. Since the growth of the first GaN layer 102 is continued together with the growth of the second GaN layer 104, a surface of the substrate is planarized as shown in FIG. 1. Therefore, a process of planarizing the surface of the semiconductor substrate 100 according to the first exemplary embodiment may be omitted.

Subsequently, referring to FIG. 1(E), the sapphire substrate 101 is separated from the first GaN layer 102. Referring to FIG. 1(F), the GaN substrate 100 can be obtained by grinding the remaining portion of the first GaN layer 102. The GaN substrate 100 may be used as a substrate for device fabrication by attaching a silicon-based substrate such as Si or SiC to the top surface of the GaN substrate 100 and then planarizing the bottom surface of the GaN substrate 100. Further, the voids 102a formed in the first GaN layer 102 may be used when the sapphire substrate 101 is separated. The sapphire substrate 101 may be separated from the first GaN layer 102 using any suitable method. For example, a laser lift-off technique or grinding technique may be used to separate the sapphire substrate 101. As another example, the sapphire substrate 101 may be twisted to be separated from the first GaN layer 102.

As described above, the semiconductor substrate 100 having a GaN layer is formed using the MOCVD technique, so that the first GaN layer 102 can be easily separated from the sapphire substrate 101 using the voids 102a, and the separated GaN layers can be used as a GaN substrate. Accordingly, the GaN substrate can be fabricated at a low cost as compared with a conventional GaN substrate.

Hereinafter, a first example of the method of fabricating the semiconductor substrate 100 according to the first exemplary embodiment will be described. In the first example, a process of forming a second GaN layer 104 using an MOCVD apparatus will be described. Using trimethylgallium (TMGa) as a source gas flowing at a rate of 20 µmol/min, crystal growth was performed for 5 hours at a heating temperature of 1,045° C. In the first example, a Ta layer 103 having a thickness of 50 nm was formed in the shape of stripes on a first GaN layer 102.

Figure 2:
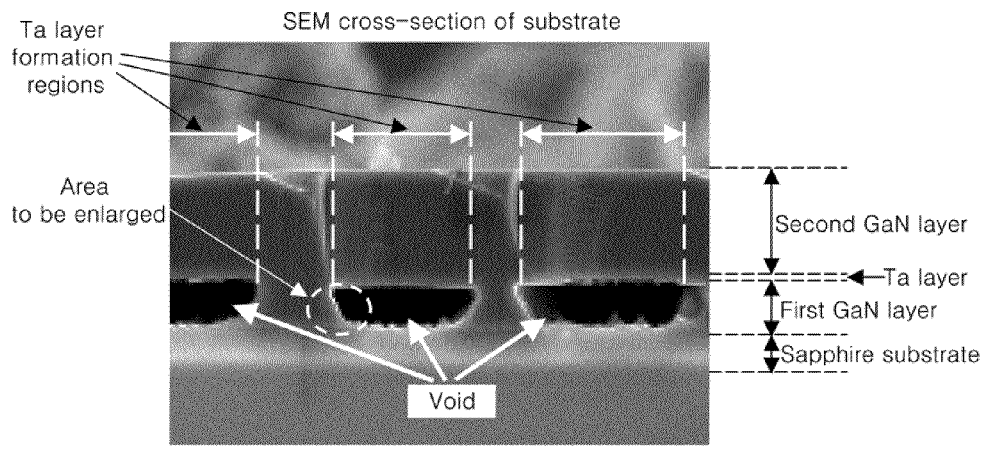
FIG. 2 is a scanning electron microscope (SEM) cross-section of a semiconductor substrate according to the first example of the first exemplary embodiment.
Figure 3:
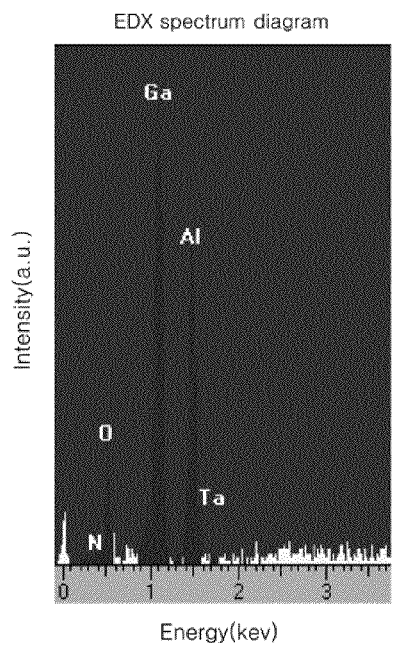
FIG. 3 is an energy dispersive x-ray spectroscope (EDX) spectrum diagram of the semiconductor substrate according to the first example of the first exemplary embodiment.

The semiconductor substrate 100 with the second GaN layer 104 completely formed under the aforementioned conditions is shown in FIG. 2. FIG. 2 is a SEM cross-section of a portion of the semiconductor substrate 100. As illustrated in FIG. 2, voids 102a are formed in the first GaN layer 102 under the formation regions of the Ta layer 103. FIG. 3 illustrates the results of analyzing the enlarged region indicated in FIG. 2, which includes a void 102a, using an energy dispersive x-ray microscope (EDX).

As illustrated in the EDX spectrum diagram of FIG. 3, GaN in the first GaN layer 102 and Al and O in a sapphire substrate 101 were observed, but Ta was almost not observed. As illustrated in EDX diagrams of FIG. 4(B), FIG. 4(C), and FIG. 4(D), Ga in the first GaN layer 102 and Al and O in the sapphire substrate 101 were observed, but Ta was not observed.

In the first example, it was observed that holes 103a were formed in the Ta layer 103 during the process of forming the second GaN layer 104. The analysis result of the holes 103a formed in the Ta layer 103 will be further illustrated in FIG. 5 and FIG. 6. FIG. 5 and FIG. 6 show a result analyzed by an EDX of a method of forming the second GaN layer 104 using the MOCVD apparatus.

FIG. 5(A) is a SEM cross-section of the semiconductor substrate 100, and FIG. 5(B) is a SEM surface of the semiconductor substrate 100. FIG. 6(A) is a Ga EDX diagram of the surface of the semiconductor substrate 100 in FIG. 5(B), and FIG. 6(B) is a Ta EDX diagram of the surface of the semiconductor substrate 100 in FIG. 5(B).

In the SEM cross-section of the semiconductor substrate 100 shown in FIG. 5(A), it was observed that voids 102a were formed by etching the first GaN layer 102 under the Ta layer 103. In the SEM surface photograph of the semiconductor substrate 100 shown in FIG. 5(B), it was observed that holes 103a were formed on a surface of the Ta layer 103. FIG. 6(A) and FIG. 6(B) respectively illustrate Ga and Ta EDX diagrams obtained by analyzing the surface of the Ta layer 103 including the holes 103a. As illustrated in the EDX diagrams, the Ta layer 103 remains and Ga and GaN are grown on the Ta layer 103.

As described above, in the semiconductor substrate 100 according to the first example, the conditions for forming the second GaN layer 104 are controlled using the MOCVD apparatus, so that the voids 102a can be formed in the first GaN layer 102 through etching using the Ta layer 103. Thus, when forming the second GaN layer 104 of the aforementioned first exemplary embodiment, the voids 102a can be formed in the first GaN layer 102 by etching, together with the growth of the first GaN layer 102. That is, the voids 102a can be formed in the first GaN layer 102 by forming a metallic material layer on portions of the first GaN layer 102. The metallic material layer may be used for etching the first GaN layer 102 as discussed above in relation to the first exemplary embodiment.

The setting conditions of the MOCVD apparatus illustrated in the first example are only for illustrative purposes, and may be conditions under which the growth of the first GaN layer 102 and the formation of the voids 102a can be simultaneously performed. However, in the process of growing the second GaN layer 104, the growth rate of the first GaN layer 102 is lower than that of the second GaN layer 104. Hence, in the first example, the setting conditions of the MOCVD apparatus were adjusted to be consistent with the growth rate of the first GaN layer 102.

Although it has been illustrated in the first example that the holes 103a are formed in the Ta layer 103 in the process of growing the second GaN layer 104, the Ta layer 103 may be formed using a pattern mask having holes previously formed when forming the Ta layer 103. The shape of the Ta layer 103 is not limited to the stripe shape but may be modified to be suitable for a device structure formed on the semiconductor substrate 100, and the like. An example of the device formed on the semiconductor substrate 100 will be described later.

The semiconductor substrate 100 illustrated in the first example may be re-used as the substrate 101 for forming the GaN layer having voids. The GaN substrate may be separated and then a surface of the sapphire substrate 101 on which a new GaN substrate is formed may be planarized by reactive ion etching (RIE) or the like. Accordingly, a fabrication cost of the GaN substrate can be reduced.

In a second example of the first exemplary embodiment, a process of forming a second GaN layer 104 using an MOCVD apparatus will be described. While using TMGa as a source gas flowing at a rate of 20 µmol/min, crystal growth was performed for 5 hours at a heating temperature of 1,045° C. In the second example, a Ta layer 103 having a thickness of 30 nm was formed in the shape of stripes on a first GaN layer 102.

Figure 12:
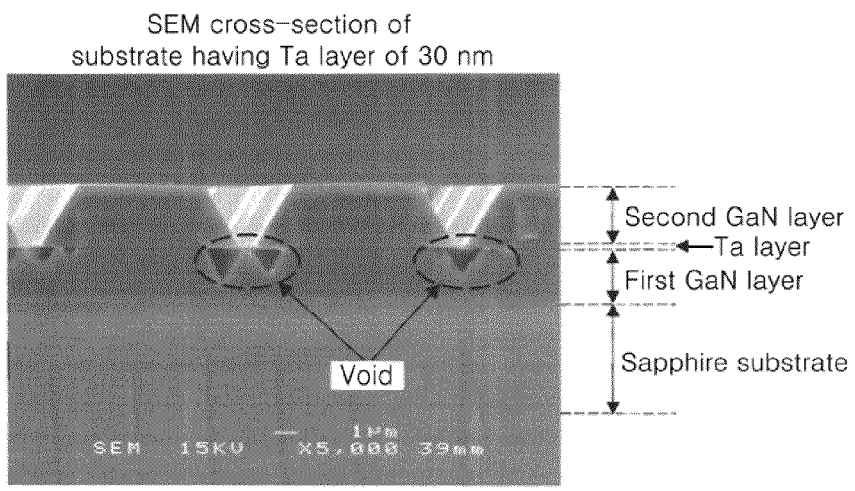
FIG. 12 is a SEM cross-section of a semiconductor substrate according to a second example of the first exemplary embodiment

The semiconductor substrate 100 with the second GaN layer 104 completely formed under the aforementioned conditions is shown in FIG. 12. FIG. 12 is a SEM cross-section of a portion of the semiconductor substrate 100. As illustrated in this figure, voids 102a are formed in the first GaN layer 102 under the formation regions of the Ta layer 103. In the second example, it was observed that holes 103a were formed in the Ta layer 103 during the process of forming the second GaN layer 104.

In the semiconductor substrate 100 according to the second example, the conditions for forming the second GaN layer 104 are controlled using the MOCVD apparatus, so that the voids 102a can be formed in the first GaN layer 102 through etching using the Ta layer 103. Thus, when forming the second GaN layer 104 of the aforementioned first exemplary embodiment, the voids 102a can be formed in the first GaN layer 102 by etching, together with the growth of the first GaN layer 102. That is, the voids 102a can be formed in the first GaN layer 102 by forming a metallic material layer on portions of the first GaN layer 102. The metallic material layer may be used for the etching the first GaN layer 102 as discussed above in relation to the first exemplary embodiment.

In the sectional view shown in FIG. 12, voids 102a caused by etching are formed in the entire portion directly under the Ta layer 103 and in the first GaN layer 102 under both left and right end portions of the Ta layer 103. FIG. 12 shows that the etching in the first GaN layer 102 is performed from both the left and right end portions of the Ta layer 103.

The setting conditions of the MOCVD apparatus illustrated in the second example are only for illustrative purposes, and may be conditions under which the growth of the first GaN layer 102 and the formation of the voids 102a can be simultaneously performed. However, in the process of growing the second GaN layer 104, the growth rate of the first GaN layer 102 is lower than that of the second GaN layer 104. Hence, in the second example, the setting conditions of the MOCVD apparatus were adjusted to be suitable for the growth rate of the first GaN layer 102.

Although it has been illustrated in the second example that the holes 103a are formed in the Ta layer 103 in the process of growing the second GaN layer 104, the Ta layer 103 may be formed using a pattern mask having holes previously formed when forming the Ta layer 103. The shape of the Ta layer 103 is not limited to the stripe shape but may be modified to be suitable for a device structure formed on the semiconductor substrate 100, and the like. An example of the device formed on the semiconductor substrate 100 will be described later.

The semiconductor substrate 100 illustrated in the second example may be re-used as the substrate 101 for forming the GaN layer having voids. The GaN substrate may be separated and then a surface of the sapphire substrate 101 on which a new GaN substrate is formed may be planarized, by reactive ion etching (RIE) or the like. Accordingly, a fabrication cost of the GaN substrate can be reduced.

In a third example of the first exemplary embodiment, a process of forming a second GaN layer 104 using an MOCVD apparatus will be described. While using TMGa as a source gas flowing at a rate of 20 μmol/min, crystal growth was performed for 5 hours at a heating temperature of 1,045° C. In the third example, a Ta layer 103 having a thickness of 50 nm was formed in the shape of stripes on a first GaN layer 102.

Figure 13:
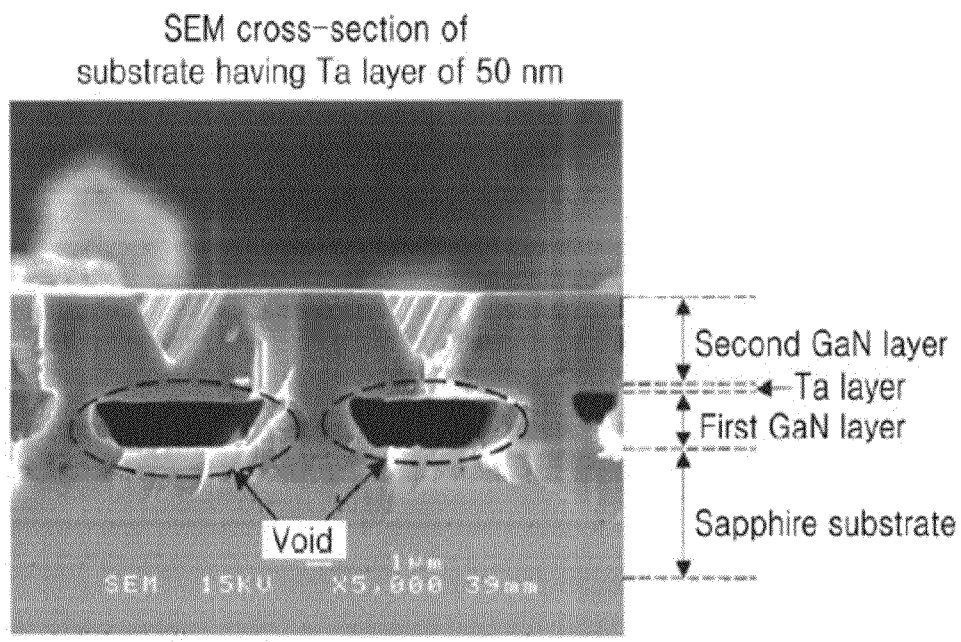
FIG. 13 is a SEM cross-section of a semiconductor substrate according to a third example of the first exemplary embodiment.

The semiconductor substrate 100 with the second GaN layer 104 completely formed under the aforementioned conditions is shown in FIG. 13. FIG. 13 is a SEM cross-section of a portion of the semiconductor substrate 100. As illustrated in this figure, voids 102a are formed in the first GaN layer 102 under the formation regions of the Ta layer 103. In the third example, it was observed that holes 103a were formed in the Ta layer 103 during the process of forming the second GaN layer 104.

In the semiconductor substrate 100 according to the third example, the conditions for forming the second GaN layer 104 are controlled using the MOCVD apparatus, so that the voids 102a can be formed in the first GaN layer 102 through etching using the Ta layer 103. Thus, when forming the second GaN layer 104 of the aforementioned first exemplary embodiment, the voids 102a can be formed in the first GaN layer 102 by etching, together with the growth of the first GaN layer 102. That is, the voids 102a can be formed in the first GaN layer 102 by forming a metallic material layer on portions of the first GaN layer 102. The metallic material layer may be used for etching the first GaN layer 102 as discussed above in relation to the first exemplary embodiment.

The setting conditions of the MOCVD apparatus illustrated in the third example are only for illustrative purposes, and may be conditions under which the growth of the first GaN layer 102 and the formation of the voids 102a can be simultaneously performed. However, in the process of growing the second GaN layer 104, the growth rate of the first GaN layer 102 is lower than that of the second GaN layer 104. Hence, in the third example, the setting conditions of the MOCVD apparatus were adjusted to be suitable for the growth rate of the first GaN layer 102.

Although it has been illustrated in the third example that the holes 103a are formed in the Ta layer 103 in the process of growing the second GaN layer 104, the Ta layer 103 may be formed using a pattern mask having holes previously formed when forming the Ta layer 103. The shape of the Ta layer 103 is not limited to the stripe shape but may be modified to be suitable for a device structure formed on the semiconductor substrate 100, and the like. An example of the device formed on the semiconductor substrate 100 will be described later.

The semiconductor substrate 100 illustrated in the third example may be re-used as the substrate 101 for forming the GaN layer having voids. The GaN substrate may be separated and then a surface of the sapphire substrate 101 on which a new GaN substrate is formed may be planarized, by reactive ion etching (RIE) or the like. Accordingly, a fabrication cost of the GaN substrate can be reduced.

In a fourth example of the first exemplary embodiment, a process of forming a second GaN layer 104 using an MOCVD apparatus will be described. While using TMGa as a source gas flowing at a rate of 20 μmol/min, crystal growth was performed for 5 hours at a heating temperature of 1,045° C. In the fourth example, a Ta layer 103 having a thickness of 100 nm was formed in the shape of stripes on a first GaN layer 102.

Figure 14:
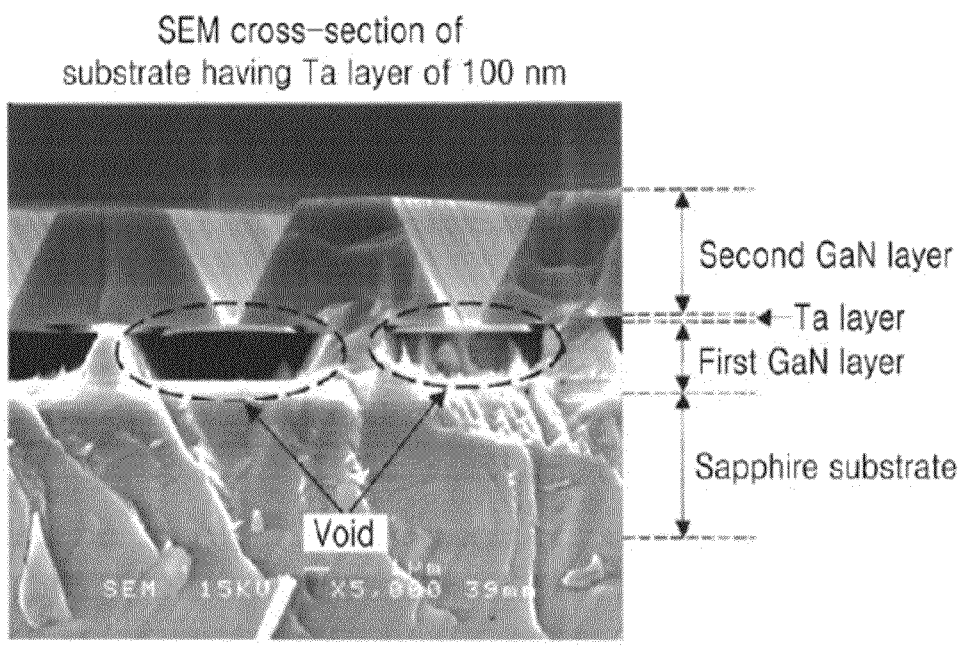
FIG. 14 is a SEM cross-section of a semiconductor substrate according to a fourth example of the first exemplary embodiment.

The semiconductor substrate 100 with the second GaN layer 104 completely formed under the aforementioned conditions is shown in FIG. 14. FIG. 14 is a SEM cross-section of a portion of the semiconductor substrate 100. As illustrated in this figure, voids 102a are formed in the first GaN layer 102 under the formation regions of the Ta layer 103. In the fourth comparative example, it was observed that holes 103a were formed in the Ta layer 103 during the process of forming the second GaN layer 104.

In the semiconductor substrate 100 according to the fourth example, the conditions for forming the second GaN layer 104 are controlled using the MOCVD apparatus, so that the voids 102a can be formed in the first GaN layer 102 through etching using the Ta layer 103. Thus, when forming the second GaN layer 104 of the aforementioned first exemplary embodiment, the voids 102a can be formed in the first GaN layer 102 by etching, together with the growth of the first GaN layer 102. That is, the voids 102a can be formed in the first GaN layer 102 by forming a metallic material layer on portions of the first GaN layer 102. The metallic material layer may be used for etching the first GaN layer 102 as discussed above in relation to the first exemplary embodiment.

The setting conditions of the MOCVD apparatus illustrated in the fourth example are only for illustrative purposes, and may be conditions under which the growth of the first GaN layer 102 and the formation of the voids 102a can be simultaneously performed. However, in the process of growing the second GaN layer 104, the growth rate of the first GaN layer 102 is lower than that of the second GaN layer 104. Hence, in the fourth example, the setting conditions of the MOCVD apparatus were adjusted to be suitable for the growth rate of the first GaN layer 102.

Although it has been illustrated in the fourth example that the holes 103a are formed in the Ta layer 103 in the process of growing the second GaN layer 104, the Ta layer 103 may be formed using a pattern mask having holes previously formed when forming the Ta layer 103. The shape of the Ta layer 103 is not limited to the stripe shape but may be modified to be suitable for a device structure formed on the semiconductor substrate 100, and the like. An example of the device formed on the semiconductor substrate 100 will be described later.

The semiconductor substrate 100 illustrated in the fourth example may be re-used as the substrate 101 for forming the GaN layer having voids. The GaN substrate may be separated and then a surface of the sapphire substrate 101 on which a new GaN substrate is formed may be planarized, by reactive ion etching (RIE) or the like. Accordingly, a fabrication cost of the GaN substrate can be reduced.

Hereinafter, a first comparative example will be described for the comparison with the first example of the first exemplary embodiment. In this comparative example, a detailed example of forming a second GaN layer 104 of a semiconductor substrate 100 by changing the setting conditions of an MOCVD apparatus will be described.

In the first comparative example, while using TMGa as a source gas flowing at a rate of 87 μmol/min, crystal growth was performed for 5 hours at a heating temperature of 1,045° C.

The semiconductor substrate 100 with the second GaN layer 104 completely formed under the aforementioned conditions is shown in FIG. 7. FIG. 7(A) is a SEM cross-section of a portion of the semiconductor substrate 100, and FIG. 7(B) is a SEM surface photograph of a partially enlarged surface of FIG. 7(A). As illustrated in this figure, a particulate substance was extracted on the surface of the second GaN layer 104, and voids 102a were formed in a first GaN layer 102 under the formation regions of Ta layer 103. EDX and CL analysis shows that the particulate substance is Ga, N, and Ta particles.

FIG. 8 illustrates the result obtained by analyzing the surface of the particulate substance with an EDX. FIG. 8(A), FIG. 8(B), and FIG. 8(C) are a spectrum diagram, a Ga EDX diagram, and an N EDX diagram obtained by analyzing the particulate substance of FIG. 7(B) with an EDX, respectively. As illustrated in the spectrum diagram of FIG. 8(A), Ga, N and a small amount of Ta were observed. As illustrated in the EDX diagrams of FIG. 8(B) and FIG. 8(C), Ga and N were observed.

The results obtained by analyzing a cross section of the particulate substance with an EDX are illustrated in FIG. 9 and FIG. 10. FIG. 9(A) is an enlarged SEM cross-section of the particulate substance of FIG. 7(B) at a void portion, and FIG. 9(B) is a spectrum diagram obtained by analyzing the cross section of FIG. 9(A) with an EDX. FIG. 10(A), FIG. 10(B) and FIG. 10(C) are a Ga EDX diagram, an N EDX diagram, and a Ta EDX diagram obtained by analyzing the cross section illustrated in FIG. 9(A) with an EDX, respectively.

As illustrated in the spectrum diagram of FIG. 9(B), Ga and N in the second GaN layer 104 and the particulate substance, Ta in the Ta layer 103, and Al and O in the sapphire substrate 101 were observed. As illustrated in FIG. 10(A), FIG. 10(B), and FIG. 10(C), Ga, N, and Ta were observed in the void portion.

The observed results indicate that the particulate substance extracted on the surface of the second GaN layer 104 is Ga, N, and Ta particles. That is, in the first comparative example, the binding between Ga and N was broken at etched portions of the first GaN layer 102, and the reaction and gasification of GaO was stopped, whereby the Ga, N, and Ta particles were extracted.

When the flow rate of TMGa was set to be 87 μmol/min in the setting conditions of the MOCVD apparatus of the first comparative example, the aforementioned particulate substance was extracted on the substrate. Therefore, the semiconductor substrate 100 was not suitable to use as a substrate. Accordingly, a flow rate X of TMGa, at which the particulate substance is not extracted on the substrate, is preferably in the range of X<87 μmol/min.

Formation of $Ta_2O_5$ Region of Ta Layer

The first, second, third, and fourth examples show that the thickness of the Ta layer 103 is varied to be 30 nm, 50 nm and 100 nm. Although the thickness of the Ta layer 103 is varied, the voids 102a are formed in the first GaN layer 104 through etching.

FIG. 15 schematically illustrates that in the Ta layer 103, the production region of $Ta_2O_5$ varies depending on the thickness of the Ta layer 103. FIG. 15(A) schematically illustrates an example in which the 5 nm thick Ta layer 103 is changed into $Ta_2O_5$, and FIG. 15(B) schematically illustrates an example in which a surface of the 100 nm thick Ta layer 103 is changed into $Ta_2O_5$. The Ta layer 103 is exposed in the air while moving the substrate 101 to an MOCVD apparatus after depositing the Ta layer 103 on the surface of the first GaN layer 102 by an EB deposition apparatus. The Ta layer 103 is changed into $Ta_2O_5$ by allowing Ta to react with oxygen while the Ta layer 103 is exposed in the air. For this reason, the entire Ta layer 103 is changed into $Ta_2O_5$ when the Ta layer 103 is 5 nm thick, as shown in FIG. 15(A), while the surface of the Ta layer 103 is changed into $Ta_2O_5$ when the Ta layer 103 is 100 nm thick, as shown in FIG. 15(B). That is, when Ta comes in contact with air at a room temperature, $Ta_2O_5$ is produced. FIG. 15(A) schematically illustrates an example in which a 5 nm thick Ta layer is grown in a lateral direction on a GaN layer. In addition, a practical example in which a 10 nm thick $Ta_2O_5$ layer is grown in a lateral direction on a substrate is illustrated in FIG. 16. In both examples, the growth is continued without etching of the GaN layer under the Ta layer. That is, in FIG. 15(A), a 5 nm thick $Ta_2O_5$ layer was formed as a result of moving the substrate having a 5 nm thick Ta layer formed thereon to an MOCVD apparatus in the air. $Ta_2O_5$ is an excellent mask grown in a lateral direction. Meanwhile, when the 100 nm thick Ta layer as shown in FIG. 15(B) is formed, the result is changed. When a Ta layer is formed though EB deposition, since Ta of a source is deposited in the air, a thin oxide layer is deposited on the surface of the Ta layer. As the deposition continues, Ta is initially changed into $Ta_2O_5$. However, formation of $Ta_2O_5$ is gradually reduced, and Ta metal is deposited. Thus, the $Ta_2O_5$ layer on the GaN layer has a thickness of 5 nm or less, and partially contains Ta. An upper layer on the $Ta_2O_5$ layer is made of Ta. A thin $Ta_2O_5$ layer is formed on the surface of the Ta layer by forming the Ta layer and then moving the substrate to an MOCVD apparatus in the air. As a result, the surface of the Ta layer is surrounded by the thin $Ta_2O_5$ layer. In the Ta layer, the $Ta_2O_5$ layer on the GaN layer is a layer having Ta partially mixed therein, which is schematically shown in FIG. 15(B). Although N in the GaN layer and Ta in the Ta layer may produce TaN, Ga in the GaN layer is the same as that deposited in vapor-phase growth, whereby the Ga itself is used as a source.

In the first, second, third, and fourth examples, the $Ta_2O_5$ region in which the Ta layer 103 is oxidized is grown in a lateral direction with respect to the first GaN layer 102, thereby functioning as an excellent etching mask. For this reason, the $Ta_2O_5$ region is not formed at both left and right end portions of the 30 nm thick Ta layer 103, but the voids 102a are formed from the first GaN layer 102 positioned under these portions, as shown in FIG. 12 of the second example. In the third and fourth examples, in which the Ta layer 103 is formed to have thicknesses of 50 nm and 100 nm, respectively, the $Ta_2O_5$ region is formed on the surface of the Ta layer 103 and hence functions as an etching mask for the first GaN layer 102. Therefore, the voids 102a are formed in the same manner.

Thus, a thickness of the Ta layer 103 on which the Ta$_2$O$_5$ region functioning as an etching mask is formed may be 20 to 100 nm as illustrated in the first, second, third, and fourth examples. In FIG. 16(A) the 5 nm thick Ta mask is formed on the first GaN layer 102, voids 102a were not formed under the Ta mask. In FIG. 16(B) in which only a 10 nm thick Ta$_2$O$_5$ mask is formed, the Ta$_2$O$_5$ mask can be formed on a GaN layer or an InGaAlN layer, for example. Thus, since the Ta$_2$O$_5$ mask is formed regardless of the thickness of the Ta layer 103, the voids 102a can be formed in the first GaN layer 102 positioned under the Ta$_2$O$_5$ mask, as shown in the first, second, third, and fourth examples.

In a second exemplary embodiment, an LED formed on the semiconductor substrate 100 illustrated in the first exemplary embodiment will be described with reference to FIG. 11.

Figure 11:
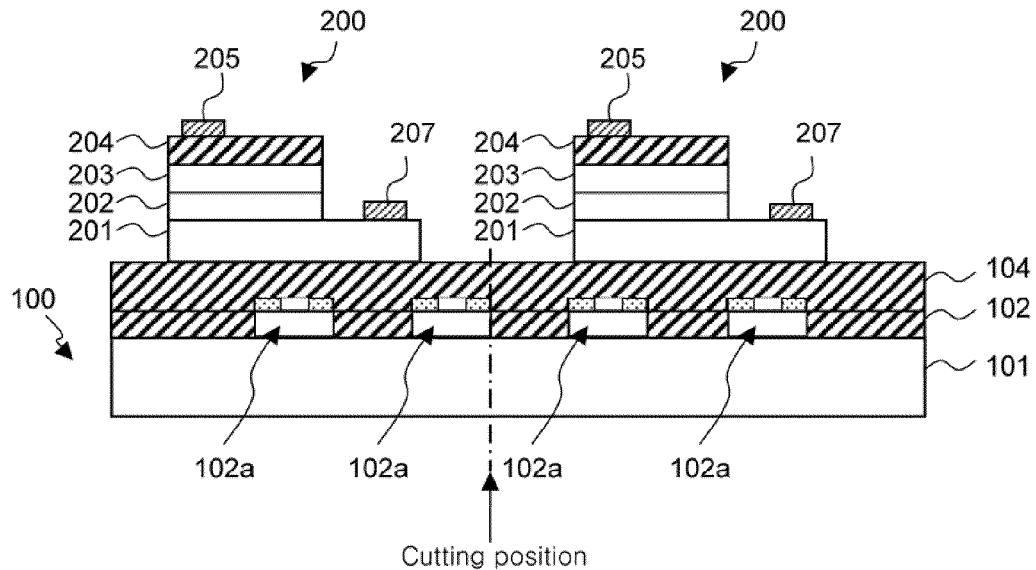
FIG. 11 is a sectional view illustrating the configuration of an LED array according to a second exemplary embodiment of the present invention.

FIG. 11 is a partial sectional view illustrating an LED according to the second exemplary embodiment of the present invention.

In FIG. 11, a plurality of LEDs 200 are spaced apart from each other on a semiconductor substrate 100. Each LED 200 comprises a lower semiconductor layer 201 as a first compound semiconductor layer, an active layer 202, and an upper semiconductor layer 203 as a second compound semiconductor layer. The lower semiconductor layer 201 and the upper semiconductor layer 203 may comprise the same class as the first GaN layer 102 and the second GaN layer 104. The active layer 202 may have a single or multiple well structure having layers and barrier layers, and the material and composition of the active layer 202 may be selected depending on the required wavelength of light. For example, the active layer 202 may be formed of a GaN-based compound semiconductor. The lower semiconductor layer 201 and the upper semiconductor layer 203 may be formed of a material having a band gap larger than that of the active layer 202 and may be made of a GaN-based compound semiconductor.

In the present exemplary embodiment, the lower semiconductor layer 201 formed on the semiconductor substrate 100 is formed on the second GaN layer 104. Thus, the LEDs 200 are fabricated using the semiconductor substrate 100, thereby reducing fabrication costs.

The upper semiconductor layer 203 is positioned on a portion of the lower semiconductor layer 201, and the active layer 202 is interposed between the upper semiconductor layer 203 and the lower semiconductor layer 201. An upper electrode layer 204 may be formed on the upper semiconductor layer 203. The upper electrode layer 204 may be formed of a material such as indium tin oxide (ITO) or Ni/Au.

In addition, an upper electrode pad 205 is formed on the upper electrode layer 204, and a lower electrode 207 is formed on an exposed portion of the lower semiconductor layer 201.

As such, individual LEDs 200 can be separated from each other by forming the plurality of LEDs 200 on the single semiconductor substrate 100 and then cutting the semiconductor substrate 100 at the cutting position shown in this figure. The upper electrode pad 205 and the lower electrode pad 207 may be vertically disposed on the LED 200. That is, a vertical type LED may be fabricated by separating a sapphire substrate 101 using voids 102a, planarizing the separated surface of the first GaN layer 102 through RIE or the like, and then forming an upper electrode pad 205 and a lower electrode pad 207.

As described above, a plurality of LEDs 200 are formed using the semiconductor substrate 100, thereby reducing manufacturing costs of LEDs. Further, when the LEDs 200 are formed on the second GaN layer 104, a compound semiconductor is formed so that the second GaN layer 104 and the lower semiconductor layer 201 have different refractive indices, thereby enhancing a light emitting efficiency and thus making it possible to form an high brightness LED array. Furthermore, if a laser diode is formed using the semiconductor substrate 100, it is formed on the GaN layer which has a higher thermal conductivity than that of the sapphire substrate 101. Thus, the laser diode's heat dissipation characteristic can be improved, thereby promoting a long lifetime of the laser diode.

Although the second exemplary embodiment has been described such that the LEDs 200 are formed on the second GaN layer 104 of the semiconductor substrate 100, the LEDs 200 may be formed in the same manner by using the GaN substrate from the sapphire substrate 101. Alternatively, a semiconductor device such as an FET may be formed by attaching a silicon-based substrate such as Si or SiC to the separated surface of the GaN substrate (which was separated from the sapphire substrate 101), and grinding the separated surface through RIE or the like. In this case, it is possible to fabricate a high-current device.

Accordingly, a semiconductor device such as an LED or a laser diode is formed using the semiconductor substrate 100, so that a high-performance semiconductor device can be easily fabricated at a low cost without using expensive GaN substrate.

Although it has been described in the exemplary embodiments that the Ta layer is formed as a metallic material layer, the Ta layer may be formed of an alloy of metals, an alloy of a metal and a semiconductor, or the like. The metallic material layer may be formed of another metallic material, such as those discussed in Hasegawa and Haino, for performing an etching operation with respect to the first GaN layer.

According to the present invention, it is possible to provide a fabrication method, by which a planar GaN substrate that is easily separated can be fabricated on a heterogeneous substrate at a low cost. It is also possible to realize a low price, performance enhancement, or long lifetime of a semiconductor device, such as an LED or laser diode, which is fabricated using the GaN substrate.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. A semiconductor substrate, comprising:
a substrate;
a first semiconductor layer arranged on the substrate;
a metallic material layer arranged on the first semiconductor layer;
a second semiconductor layer in direct physical contact with the first semiconductor layer and the metallic material layer; and
voids formed in the first semiconductor layer under the metallic material layer.

2. The semiconductor substrate of claim 1, wherein the first semiconductor layer and the second semiconductor layer comprise the same semiconductor material or different semiconductors material, and the metallic material layer comprises a metallic material having a higher melting point than a heating temperature at which the second semiconductor layer is formed.

3. The semiconductor substrate of claim 1, wherein the metallic material layer comprises an oxide layer.

4. The semiconductor substrate of claim 3, wherein a plurality of holes penetrates the metallic material layer.

5. The semiconductor substrate of claim 2, wherein a plurality of holes penetrates the metallic material layer.

6. The semiconductor substrate of claim 1, wherein the substrate comprises a sapphire substrate or a silicon-based substrate.

7. The semiconductor substrate of claim 1, wherein the metallic material layer comprises a tantalum layer that is at least 5 nm thick, a surface of the tantalum layer comprises tantalum oxide, and an interface between the first semiconductor layer and the tantalum layer comprises tantalum and tantalum oxide.

8. A method of fabricating a semiconductor substrate, comprising:
   forming a first semiconductor layer on a substrate;
   forming a metallic material layer on the first semiconductor layer; and
   forming a second semiconductor layer directly on the first semiconductor layer and the metallic material layer, wherein voids are formed in the first semiconductor layer under the metallic material layer while the second semiconductor layer is formed, and wherein the first semiconductor layer contacts the second semiconductor layer.

9. The method of claim 8, wherein the metallic material layer comprises a plurality of stripe-shaped portions spaced apart from each other, and
   wherein the second semiconductor layer is at least 0.5 times as thick as a width of a first stripe-shaped portion of the metallic material layer.

10. The method of claim 8, wherein the metallic material layer comprises an oxide layer.

11. The method of claim 10, wherein a plurality of holes is formed that penetrates the metallic material layer.

12. The method of claim 9, wherein a plurality of holes penetrates the metallic material layer.

13. The method of claim 8, wherein the second semiconductor layer is formed using a metal organic chemical vapor deposition technique, and while growing the second semiconductor layer, a portion of the first semiconductor layer where the metallic material layer is not formed is grown toward the second semiconductor layer.

14. The method of claim 8, wherein the first semiconductor layer and the second semiconductor layer comprise the same semiconductor material, and the metallic material layer comprise a metallic material having a higher melting point than a heating temperature at which the second semiconductor layer is formed.

15. The method of claim 8, wherein the metallic material layer comprises an oxide layer that forms a mask for the first semiconductor layer, and a plurality of holes is formed that penetrates the metallic material layer comprises through which the first semiconductor layer and the second semiconductor layer are coupled,
   wherein the second semiconductor layer is formed using a metal organic chemical vapor deposition technique, and
   wherein the first semiconductor layer formed under a portion of the metallic material layer reacts with the metallic material layer and oxygen, and the first semiconductor layer evaporates through the plurality of holes to form voids.

16. The method of claim 8, wherein the metallic material layer comprises a tantalum layer that is at least 5 nm thick, and
   wherein after the tantalum layer is formed on the first semiconductor layer, a surface of the tantalum layer comprises tantalum oxide, and an interface between the first semiconductor layer and the tantalum layer comprises tantalum and tantalum oxide.

17. The method of claim 8, wherein the substrate is a sapphire substrate or a silicon-based substrate.

18. The method of claim 8, further comprising separating the substrate from the first semiconductor layer using the voids formed in the first semiconductor layer.

19. The method of claim 18, wherein the substrate is separated by a laser lift-off technique.

20. The method of claim 18, wherein the substrate is separated by a grinding technique.

21. The method of claim 18, wherein the substrate is separated from the first semiconductor layer by twisting.

22. A semiconductor device, comprising:
   a first compound semiconductor layer arranged on the second semiconductor layer;
   an active layer arranged on the first compound semiconductor layer; and
   a second compound semiconductor layer arranged on the active layer,
   wherein the first compound semiconductor layer is arranged on the second semiconductor layer of the semiconductor substrate of claim 1.

23. The semiconductor device of claim 22, wherein the second semiconductor layer comprises a compound semiconductor of the same class as the first compound semiconductor layer, and the first compound semiconductor layer comprises a different refractive index from the second semiconductor layer.

24. The method of claim 8, further comprising:
   forming a first compound semiconductor layer on the second semiconductor layer;
   forming an active layer on the first compound semiconductor layer; and
   forming a second compound semiconductor layer on the active layer.

25. The method of claim 24, wherein the first semiconductor layer and the second semiconductor layer comprise a compound semiconductor of the same class as the first compound semiconductor layer, and the first compound semiconductor layer comprises a different refractive index from the second semiconductor layer.

* * * * *